(12) United States Patent
Tsai et al.

(10) Patent No.: US 10,825,879 B1
(45) Date of Patent: Nov. 3, 2020

(54) PIXEL STRUCTURE

(71) Applicant: HannsTouch Solution Incorporated, Tainan (TW)

(72) Inventors: Ching-Feng Tsai, Tainan (TW); Che-Yu Chuang, Tainan (TW)

(73) Assignee: HANNSTOUCH SOLUTION INCORPORATED, Tainan (TW)

( * ) Notice: Subject to any disclaimer, the term of this patent is extended or adjusted under 35 U.S.C. 154(b) by 0 days.

(21) Appl. No.: 16/664,111

(22) Filed: Oct. 25, 2019

(30) Foreign Application Priority Data

Aug. 19, 2019 (CN) .......................... 2019 1 0763455

(51) Int. Cl.
*H01L 27/32* (2006.01)

(52) U.S. Cl.
CPC ...... *H01L 27/3262* (2013.01); *H01L 27/3248* (2013.01); *H01L 27/3276* (2013.01)

(58) Field of Classification Search
CPC ............. H01L 27/3262; H01L 27/3276; H01L 27/3248; G02F 1/134309
See application file for complete search history.

(56) References Cited

U.S. PATENT DOCUMENTS

| | | | | |
|---|---|---|---|---|
| 6,956,553 | B2* | 10/2005 | Tsutsui | G09G 3/3648 |
| | | | | 345/94 |
| 10,374,025 | B2* | 8/2019 | Matsubara | H01L 27/283 |
| 10,446,557 | B2* | 10/2019 | Lee | H01L 21/28088 |
| 2014/0183520 | A1* | 7/2014 | Chang | H01L 29/66969 |
| | | | | 257/43 |

* cited by examiner

*Primary Examiner* — William Coleman
(74) *Attorney, Agent, or Firm* — Volpe Koenig

(57) ABSTRACT

A pixel structure includes a substrate and a thin-film transistor having a first top surface and disposed above the substrate. The first top surface has a first projection area. A data line has a data line adjoining area connected to the thin-film transistor. A pixel electrode has a second top surface and disposed above the thin-film transistor. The second top surface has a second projection area that is greater than the first projection area. The second projection area has a first part and a second part; the first part corresponding to the first projection area is removed by at least 50%; and the second part corresponding to the data line adjoining area is at most 70% removed. The pixel structure omits an insulation layer under the pixel electrode to lower the cost of production and speed up the manufacturing process.

18 Claims, 4 Drawing Sheets

US 10,825,879 B1

PIXEL STRUCTURE

CROSS-REFERENCE TO RELATED APPLICATION AND CLAIM OF PRIORITY

The application claims the benefit of Chinese Patent Application No. 201910763455.1, filed on Aug. 19, 2019, at the National Intellectual Property Administration, PRC, the disclosures of which are incorporated herein in their entirety by reference.

FIELD OF THE INVENTION

The invention is related to a pixel structure, and more particularly to a pixel structure for the display device of electronic shelf labels.

BACKGROUND OF THE INVENTION

In the pixel structure for the display device of electronic shelf labels, e.g., electronic paper, the area of the pixel electrode would be close to that of the whole pixel in order to let the pixel be completely driven by an electric field. If the pixel electrode does not cover the whole pixel, the part of the pixel without the pixel electrode will not be driven by the electrical field. For example, if some liquid crystals or electronic ink is not driven, a pixel which should show a black dot may appear white. The fact that colors are not precisely shown indicates that the device has a display problem. However, if the area of the pixel electrode is close to that of the whole pixel, the thin-film transistor (TFT) in the pixel would be covered. To avoid the TFT being affected by the pixel electrode, e.g., causing interference or failure, in prior art a thick insulation layer usually composed of an organic material is disposed between the pixel electrode and the TFT. Generally speaking, the thickness of the insulation layer is about 2 μm. The cost of production of the pixel structure in the prior art is relatively high.

SUMMARY OF THE INVENTION

To lower the added cost of the insulation layer whose thickness is about 2 μm in prior art, but still protect the TFT from malfunctioning due to the influence of the pixel electrode, the present invention proposes a new pixel structure. Compared to prior art, the new pixel structure omits the insulation layer whose thickness is about 2 μm under the pixel electrode to lower the cost of production and speed up the manufacturing process.

In accordance with one aspect of the present invention, a pixel structure is disclosed. The pixel structure includes: a substrate; at least one thin-film transistor having a first top surface and disposed above the substrate, wherein the first top surface has a first projection area; a data line having a data line adjoining area connected to the at least one thin-film transistor; and a pixel electrode having a second top surface and disposed above the at least one thin-film transistor, wherein the second top surface has a second projection area, wherein: the second projection area is greater than the first projection area; the second projection area has a first part and a second part; the first part corresponding to the first projection area is removed by at least 50%; and the second part corresponding to the data line adjoining area is at most 70% removed.

In accordance with a further aspect of the present invention, a pixel structure is disclosed. The pixel structure includes: a substrate; at least one thin-film transistor disposed above the substrate; a protective layer disposed on the at least one thin-film transistor, wherein the protective layer includes an inorganic material; a pixel electrode disposed above the protective layer and patterned to have a peripheral boundary; and a protective device disposed on the pixel electrode and located within the peripheral boundary for protecting the at least one thin-film transistor from malfunctioning due to an influence of the pixel electrode.

In accordance with another aspect of the present invention, a pixel structure is disclosed. The pixel structure includes: a substrate; at least one thin-film transistor disposed above the substrate and having a top surface, wherein the top surface has a projection area; a protective layer disposed on the at least one thin-film transistor, wherein the protective layer is an inorganic material; and a pixel electrode patterned to have a patterned area and disposed directly on the protective layer, wherein the patterned area is at most 120% of the projection area.

BRIEF DESCRIPTION OF THE DRAWINGS

The details and advantages of the present invention will become more readily apparent to those ordinarily skilled in the art after reviewing the following detailed descriptions and accompanying drawings.

DETAILED DESCRIPTION OF THE PREFERRED EMBODIMENT

Figure 1:
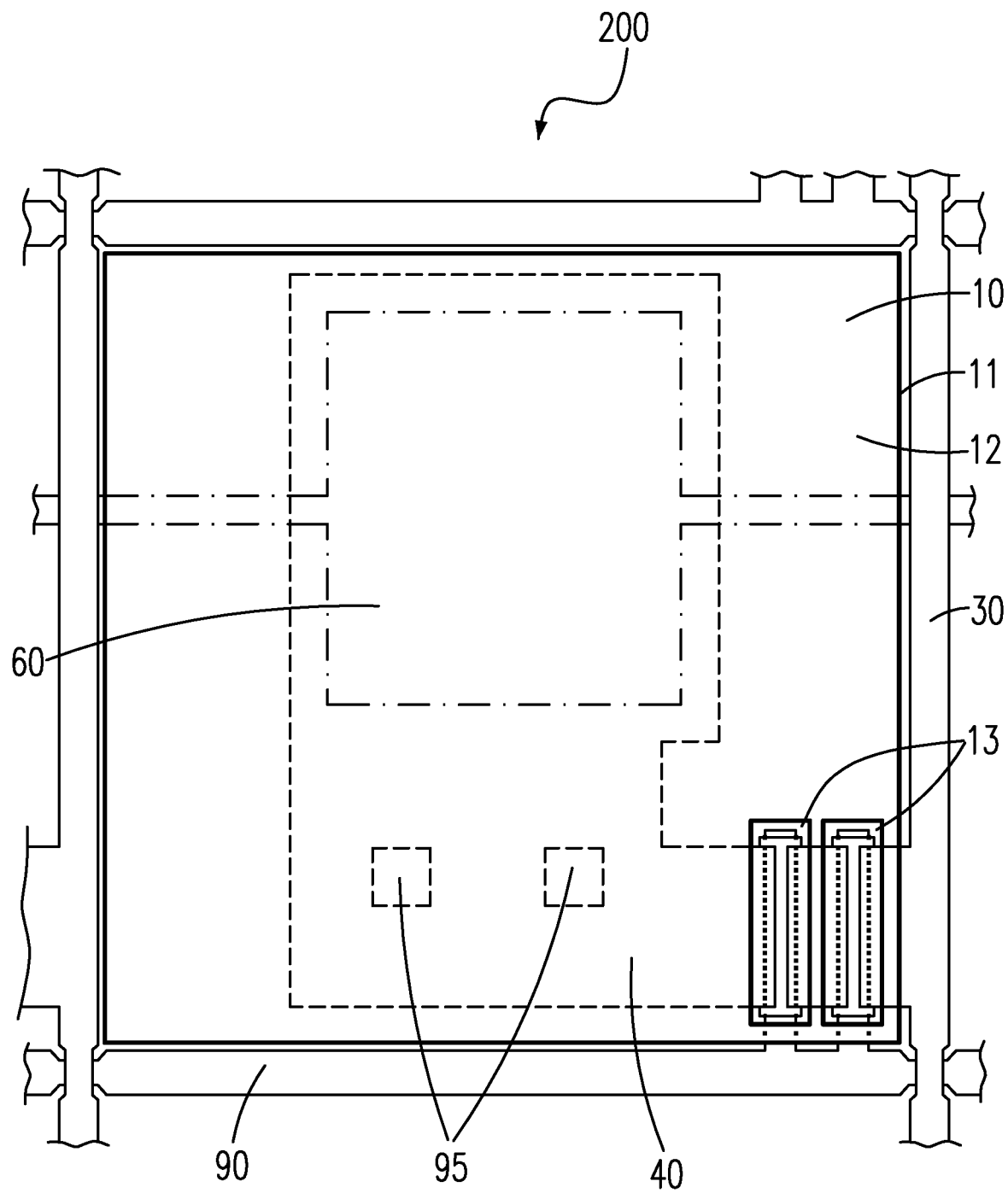
FIG. 1 is a schematic diagram of a pixel in an embodiment of the present invention when observed from above of the pixel structure.

Please refer to FIG. 1, which is a schematic diagram of a pixel 200 in an embodiment of the present invention when observed from above of the pixel structure. There are many pixels in a display device. It can be imagined that the pixel 200 is repeated in all four directions and eventually a display device is constructed. In order to show the connection relationship among the pixel 200 and other pixels, wavy lines are drawn for the data lines 30 on the left and right sides of the pixel 200 and the gate lines 90 on the upper and lower sides. When observing the structure of the pixel 200 from FIG. 1, it is seen that the pixel electrode 10 is disposed at the topmost, and has a rectangular peripheral boundary 11 (referring to the four thick black lines, wherein the two areas both surrounded by thick black lines showing removed areas at the lower right corner of FIG. 1 are temporarily ignored). The pixel electrode 10 has a top surface 12. In addition, FIG. 1 also shows the data electrode 40, the common electrode 60 and two through holes 95, wherein the through holes 95 are used to connect the data electrode 40, the common electrode 60 and the pixel electrode 10.

Figure 2:
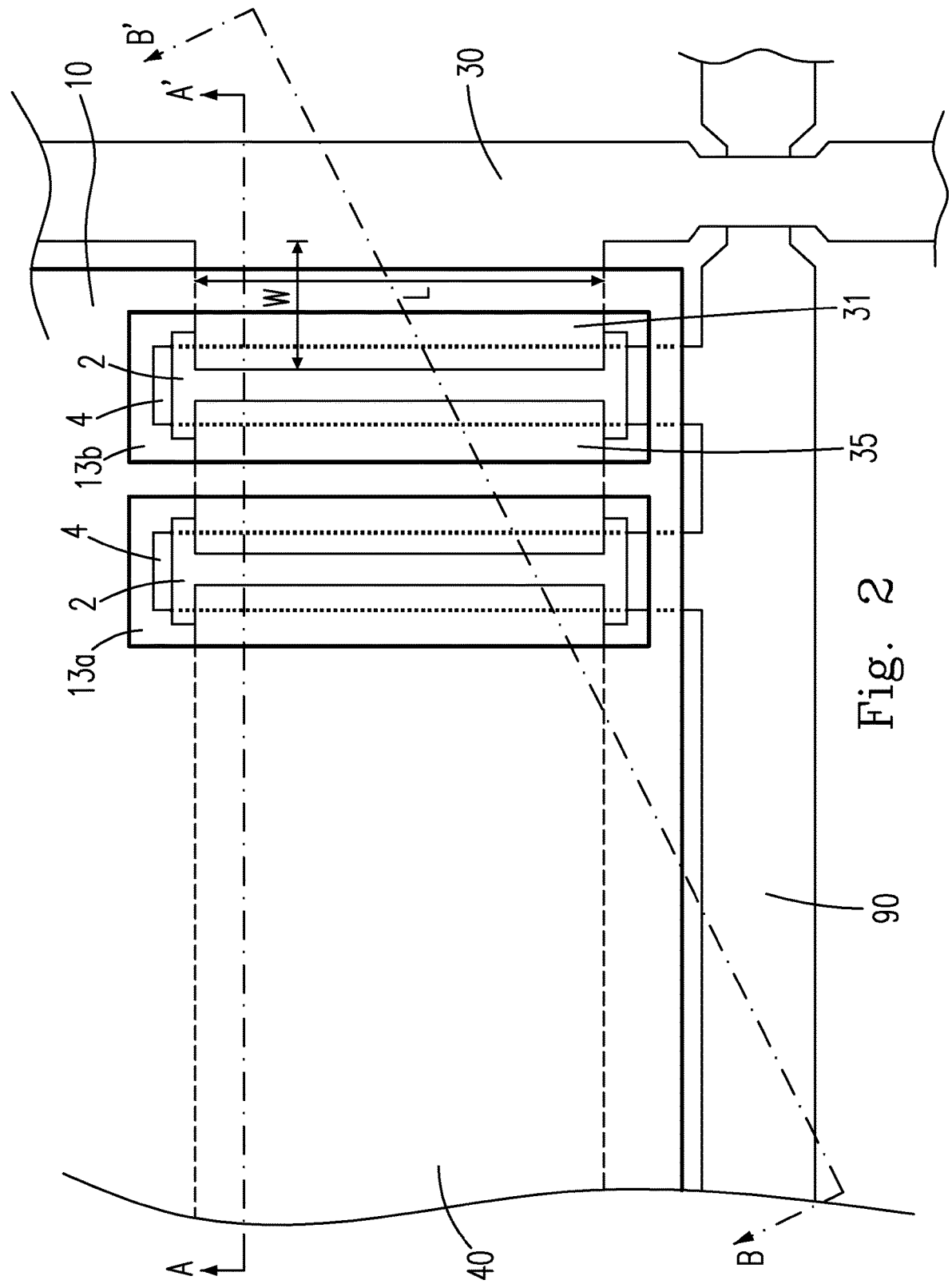
FIG. 2 is an enlarged schematic diagram of the TFTs in FIG. 1 along with their neighboring areas.
Figure 3:
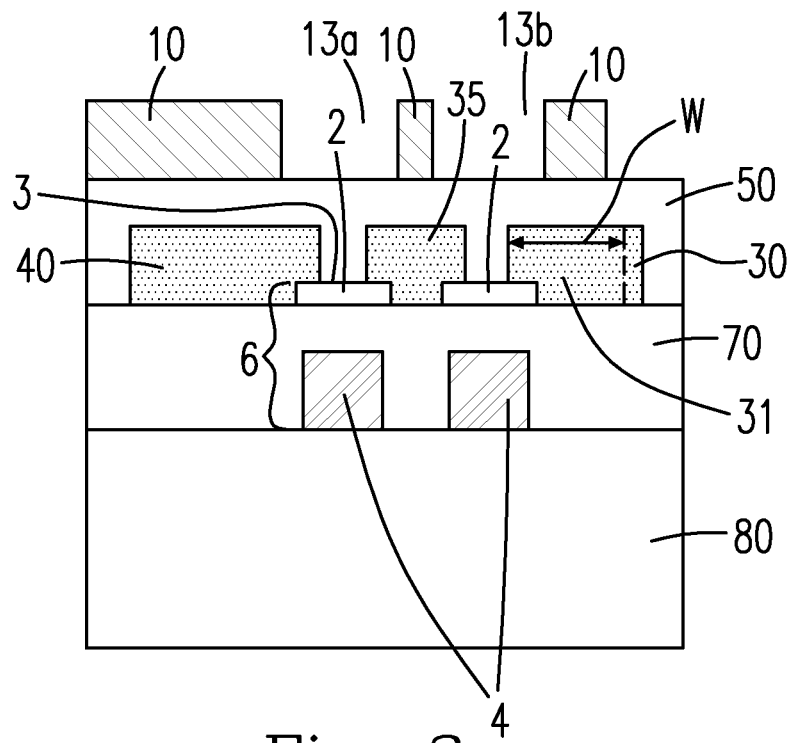
FIG. 3 is a sectional schematic diagram of a cut view of the pixel along A-A' in FIG. 2.
Figure 4:
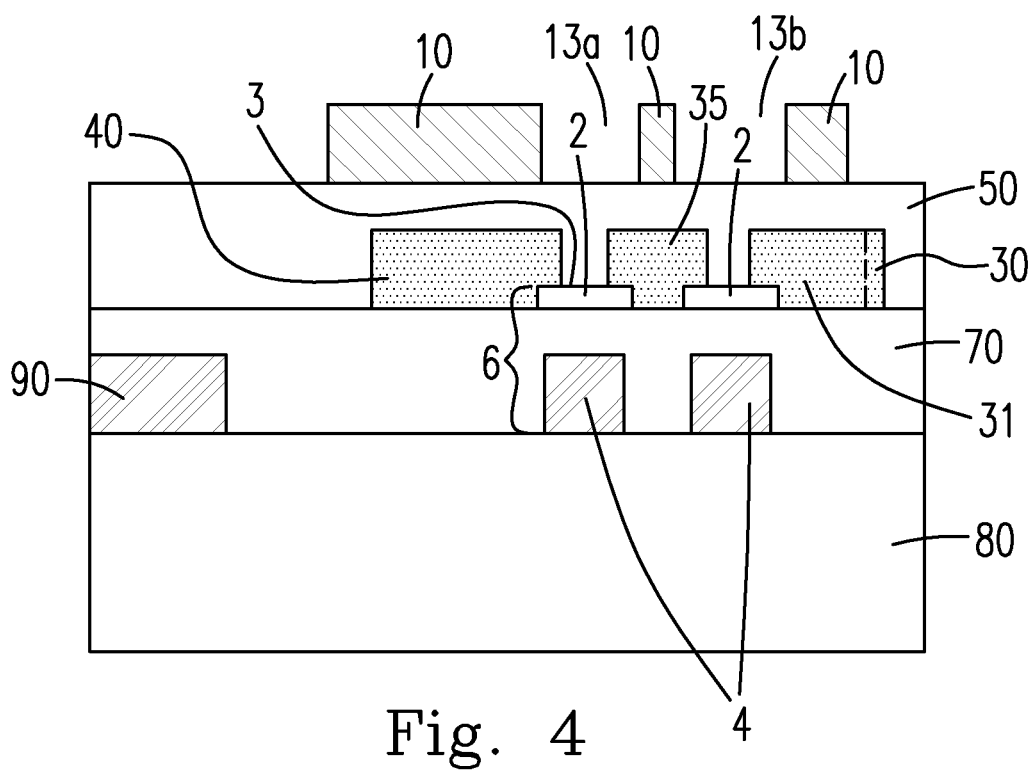
FIG. 4 is a sectional schematic diagram of a cut view of the pixel along B-B' in FIG. 2.

To explain the relationships among the elements in the pixel 200, FIGS. 2-4 are simultaneously referred to. There are two TFTs at the lower right corner of FIG. 1, whose enlarged diagram can be further referred to FIG. 2. FIG. 2 shows the TFTs along with their neighboring areas, and the positions of the cuts A-A' and B-B' of the pixel 200. FIG. 3 is a sectional schematic diagram of a cut view of the pixel 200 along A-A' in FIG. 2, and FIG. 4 is a sectional schematic diagram of a cut view of the pixel 200 along B-B' in FIG. 2. The number of TFT(s) in a pixel can be one or more. Because the pixel 200 in FIG. 1 and the enlarged schematic diagram of FIG. 2 are observed from above the pixel structure, the structures of some layers or elements of the pixel 200, e.g., the substrate, can hardly be observed from FIGS. 1 and 2. Therefore, they are shown in FIGS. 3 and 4, which offer further descriptions. Please refer to FIG. 3. There is a protective layer 50 under the pixel electrode 10 of the pixel 200. The protective layer 50 is disposed on the thin-film transistors 6, the data lines 30, the data connection area 35 and the data electrode 40, for protecting the thin-film transistors 6. The protective layer 50 is an insulation layer composed of inorganic material. The pixel 200 in the present invention has no insulation layer disposed between the pixel electrode 10 and the protective layer 50, thus greatly lowering the cost of production and speeding up the manufacturing process.

The topmost layer of the structure of the thin-film transistor (TFT) 6 is a semiconductor layer 2. In the embodiment shown in FIGS. 1-4, the data line 30 on the right side widens in the area adjoining the semiconductor layer 2 of the right TFT 6 in the two TFTs 6. The widened part is shown in FIG. 2 as an area of width W and length L. In the present invention the widened part of the data line 30 is called the data line adjoining area 31. The data line adjoining area 31 is connected with the drain (not shown) of the right TFT 6. The source (not shown) of the left TFT 6 in the two TFTs 6 is connected with the data electrode 40 of the pixel 200. The drain of the left TFT 6 and the source of the right TFT 6 are connected through the data connection area 35. Below the two semiconductor layers 2, separated by an insulation layer 70, are the respective gates 4 of the two TFTs 6. A gate line 90 is shown on the left side of FIG. 4. The gate line 90 is disposed on the same layer as that of the respective gates 4 of the two TFTs 6. Under the respective gates 4 of the two TFTs 6 and the gate line 90 is the substrate 80. The common electrode 60 (not shown) is disposed on the same layer as that of the gates 4 of the TFTs 6, and on the substrate 80.

The pixel electrode 10 is patterned to have the rectangular peripheral boundary 11. It can be imagined that the top surface 12 of the area enclosed by the peripheral boundary 11 has a second projection area, which is the rectangular area enclosed by the peripheral boundary 11. No matter how many TFTs there are in the pixel 200, the collective top surface of all the TFTs is called the first top surface, or the top surface. The first top surface has a first projection area, or the projection area, which is the horizontal projection area of the collective semiconductor layers 2 of the TFTs 6. It is known from FIGS. 1 through 4 that the second projection area is greater than the first projection area. In order to protect the TFT(s) 6 from malfunctioning due to the influence of the pixel electrode 10, a protective device 13 is disposed on the pixel electrode 10 and located within the peripheral boundary 11. In an embodiment, the protective device 13 is the second projection area of the pixel electrode 10 corresponding to the first projection area of the TFT(s) 6 and removed by at least 50%. In other words, if there is no protective device 13 disposed, when observing from above of the pixel structure, the part of the second projection area corresponding to the first projection area of the TFT(s) 6 overlaps the first projection area. The overlapped part can be called the first overlap area. In the embodiment, The protective device 13 are openings or through holes of the pixel electrode 10. When the protective device 13 is disposed, the overlapped part becomes the second overlap area. The second overlap area is less than or equal to 50% of the first overlap area. From another point of view, in one embodiment, about 36% of the part of the second projection area of the pixel electrode 10 corresponding to the data line adjoining area 31 is removed. In another embodiment, about 61% of the part of the second projection area of the pixel electrode 10 corresponding to the data line adjoining area 31 is removed. To put it another way, if what is considered is the overlap between the second projection area and the data line adjoining area 31 when observing from above of the pixel structure, then when there is no protective device 13 disposed, the part of the second projection area corresponding to the data line adjoining area 31 overlaps the data line adjoining area 31 and the overlapped part can be called the third overlap area. When the protective device 13 is disposed, the overlapped part becomes the fourth overlap area. Therefore, the third overlap area can be compared with the fourth overlap area. Generally speaking, the part of the second projection area corresponding to the data line adjoining area 31 is at most 70% removed. That is to say, the fourth overlap area is greater than or equal to 30% of the third overlap area.

In the embodiment of FIGS. 1-4, when observing from above the pixel structure, the pixel electrode 10 has hole(s) whose number is the same as that of the TFT(s) 6, the pixel electrode 10 around the hole(s) surrounds each of the TFT(s) 6, and the pixel electrode 10 is free from overlapping any one of the TFT(s) 6. That is to say, when observing from above the pixel structure, the pixel electrode 10 does not overlap the semiconductor layer(s) 2 of the TFT(s) 6.

When the protective device 13 is disposed through removing part of the second projection area of the pixel electrode 10, the protective device 13 can be completed in the same process as that of patterning the pixel electrode 10. That is, the pixel electrode 10 is patterned to have a patterned area, and the patterned area is the area of the pixel electrode 10 removed within the peripheral boundary 11. An embodiment in which the patterned area being at least 50% of the first projection area is mentioned above. In an embodiment, the patterned area is equal to the first projection area. In the embodiment of FIGS. 1-4, the patterned area is slightly greater than the first projection area. Generally speaking, the patterned area is at most 120% of the first projection area.

Figure 5:
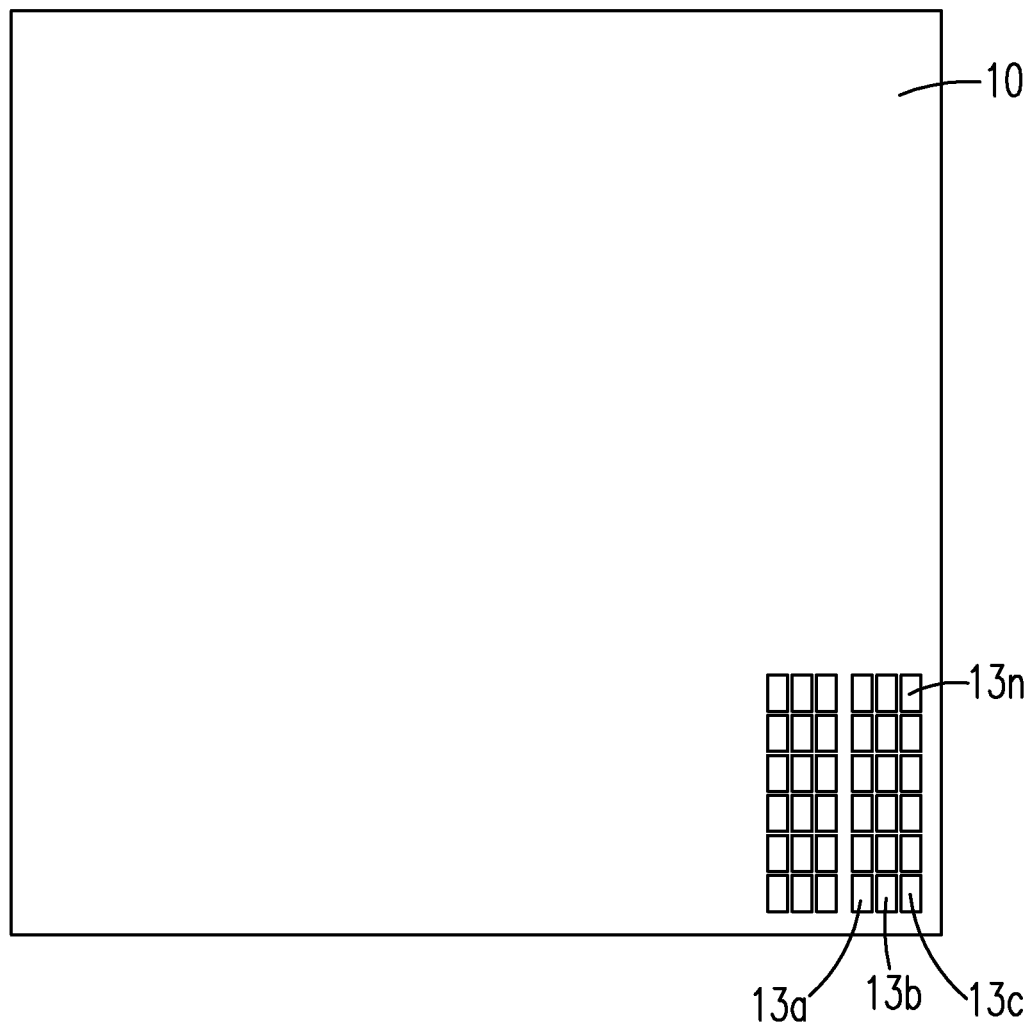
FIG. 5 is a schematic diagram of a pixel electrode which has two TFTs at the lower right corner in an embodiment of the present invention when observed from above of the pixel structure.

Because the protective device 13 is basically hole(s) in the pixel electrode 10, the pixel electrode 10 is in the form of a grid above the TFT(s) 6. For example, in the embodiment of FIGS. 2, 3 and 4, there are two TFTs and two corresponding holes 13a and 13b. The number of holes of the gridded pixel electrode 10 can also be greater than the number of TFT(s) 6. In the embodiment shown in FIG. 5, there are also two TFTs at the lower right corner. Corresponding to the right TFT in the two TFTs, the pixel electrode 10 has n corresponding holes 13a, 13b, 13c, . . . , 13n, where n is a positive integer. In the designs of the pixel electrode 10 which has part above the TFTs 6 not being hole(s), a balance is basically reached between an increase of interference in the TFTs and a more completely driven pixel. But regardless of the design of the gridded pixel electrode 10, it is completed in the same process.

The present invention also provides a display device, including a pixel having the pixel structure mentioned above. An embodiment of the display device is electronic paper. The present invention also provides an electronic shelf label, including the display device mentioned above. In summary, the pixel structure, the display device or the electronic shelf label provided by the present invention lower the cost of production and speed up the manufacturing process when compared with prior art.

EMBODIMENTS

1. A pixel structure, including: a substrate; at least one thin-film transistor having a first top surface and disposed above the substrate, wherein the first top surface has a first projection area; a data line having a data line adjoining area connected to the at least one thin-film transistor; and a pixel electrode having a second top surface and disposed above the at least one thin-film transistor, wherein the second top surface has a second projection area, wherein: the second projection area is greater than the first projection area; the second projection area has a first part and a second part; the first part corresponds to the first projection area is removed by at least 50%; and the second part corresponds to the data line adjoining area and is at most 70% removed.

2. The pixel structure according to Embodiment 1, wherein when observing from above the pixel structure, the pixel electrode has at least one hole whose number is the same as that of the at least one thin-film transistor, the pixel electrode around the at least one hole surrounds each of the at least one thin-film transistor, and the pixel electrode is free from overlapping any one of the at least one thin-film transistor.

3. The pixel structure according to Embodiment 1 or 2, wherein when observing from above the pixel structure, the pixel electrode has a plurality of holes whose number is greater than that of the at least one thin-film transistor.

4. The pixel structure according to any one of Embodiments 1-3, further comprising a protective layer disposed on the at least one thin-film transistor.

5. The pixel structure according to any one of Embodiments 1-4, wherein the protective layer includes an inorganic material.

6. The pixel structure according to any one of Embodiments 1-5, wherein the pixel electrode is disposed directly on the protective layer.

7. The pixel structure according to any one of Embodiments 1-6, wherein the pixel electrode has a patterned area at most 120% of that of the first projection area.

8. The pixel structure according to any one of Embodiments 1-7, wherein the pixel electrode has a peripheral boundary enclosing the second projection area.

9. The pixel structure according to any one of Embodiments 1-8, wherein the patterned area is removed from the pixel electrode within the peripheral boundary.

10. A pixel structure, including: a substrate; at least one thin-film transistor disposed above the substrate; a protective layer disposed on the at least one thin-film transistor, wherein the protective layer includes an inorganic material; a pixel electrode disposed above the protective layer and patterned to have a peripheral boundary; and a protective device disposed on the pixel electrode and located within the peripheral boundary for protecting the at least one thin-film transistor from malfunctioning due to an influence of the pixel electrode.

11. The pixel structure according to Embodiment 10, wherein: the at least one thin-film transistor has a first top surface having a first projection area; the pixel electrode has a second top surface having a second projection area; and the protective device is the second projection area corresponding to the first projection area and removed by at least 50%.

12. The pixel structure according to Embodiment 10 or 11, wherein the pixel electrode is disposed directly on the protective layer.

13. The pixel structure according to any one of Embodiments 10-12, wherein the pixel electrode has a patterned area at most 120% of that of the first projection area.

14. The pixel structure according to any one of Embodiments 10-13, wherein the patterned area is removed from the pixel electrode within the peripheral boundary.

15. The pixel structure according to any one of Embodiments 11-14, wherein the second projection area is enclosed by the peripheral boundary.

16. The pixel structure according to any one of Embodiments 10-15, wherein the pixel structure further comprises a data line having a data line adjoining area connected to the at least one thin-film transistor, and the second projection area corresponding to the data line adjoining area is at most 70% removed.

17. The pixel structure according to any one of Embodiments 10-16, wherein when observing from above the pixel structure, the pixel electrode has at least one hole whose number is the same as that of the at least one thin-film transistor, the pixel electrode around the at least one hole surrounds each of the at least one thin-film transistor, and the pixel electrode is free from overlapping the at least one thin-film transistor.

18. The pixel structure according to any one of Embodiments 10-17, wherein when observing from above the pixel structure, the pixel electrode has a plurality of holes whose number is greater than that of the at least one thin-film transistor.

19. A pixel structure, including: a substrate; at least one thin-film transistor disposed above the substrate and having a top surface, wherein the top surface has a projection area; a protective layer disposed on the at least one thin-film transistor, wherein the protective layer is an inorganic material; and a pixel electrode patterned to have a patterned area and disposed directly on the protective layer, wherein the patterned area is at most 120% of the projection area.

20. The pixel structure according to Embodiment 19, wherein the pixel electrode has a peripheral boundary, and the patterned area is removed from the pixel electrode within the peripheral boundary.

It is contemplated that modifications and combinations will readily occur to those skilled in the art, and these modifications and combinations are within the scope of this invention.

What is claimed is:

1. A pixel structure, comprising:
   a substrate;
   at least one thin-film transistor (TFT) disposed above the substrate, wherein each TFT includes a semiconductor layer;
   a data line having a data line adjoining area connected to the at least one TFT; and
   a pixel electrode having at least one enclosed through hole, and disposed above the at least one TFT,
   wherein:
   the at least one enclosed through hole is fully surrounded by the pixel electrode and
   the at least one enclosed through hole at a direction perpendicular to the substrate exposes both a top surface of the at least one semiconductor layer by at least 50% thereof and at least a portion of the data line adjoining area.

2. The pixel structure as claimed in claim 1, wherein when observing from above the pixel structure, the at least one enclosed through hole whose number is the same as that of the at least one TFT, the pixel electrode around the at least one enclosed through hole surrounds and exposes each of the at least one TFT, and the pixel electrode is free from overlapping any one of the at least one TFT.

3. The pixel structure as claimed in claim 1, wherein when observing from above the pixel structure, the at least one enclosed through hole includes a plurality of holes whose number is greater than that of the at least one TFT, and the plurality of holes at a direction perpendicular to the substrate expose the top surface of the at least one semiconductor layer by at least 50% in total.

4. The pixel structure as claimed in claim 1, further comprising a protective layer disposed on the at least one TFT.

5. The pixel structure as claimed in claim 1, wherein the pixel electrode has a patterned area being removed to form the at least one enclosed through hole.

6. The pixel structure as claimed in claim 4, wherein the protective layer includes an inorganic material.

7. The pixel structure as claimed in claim 4, wherein the pixel electrode is disposed directly on the protective layer.

8. The pixel structure as claimed in claim 5, wherein the pixel electrode has a peripheral boundary.

9. The pixel structure as claimed in claim 8, wherein the patterned area is removed from the pixel electrode within the peripheral boundary.

10. A pixel structure, comprising:
a substrate;
at least one thin-film transistor (TFT) disposed above the substrate, wherein each TFT includes a semiconductor layer;
a protective layer disposed on the at least one TFT, wherein the protective layer includes an inorganic material;
a pixel electrode disposed above the protective layer and patterned to have a peripheral boundary; and
a protective device having at least one enclosed through hole going through the pixel electrode, and located within the peripheral boundary for protecting the at least one TFT from malfunctioning due to an influence of the pixel electrode, wherein each enclosed through hole is fully surrounded by the pixel electrode and the at least one enclosed through hole at a direction perpendicular to the substrate exposes a top surface of the at least one semiconductor layer by at least 50% thereof.

11. The pixel structure as claimed in claim 10, wherein the pixel electrode is disposed directly on the protective layer.

12. The pixel structure as claimed in claim 10, wherein the pixel electrode has a patterned area being removed to form the at least one enclosed through hole.

13. The pixel structure as claimed in claim 10, wherein the pixel structure further comprises a data line having a data line adjoining area connected to the at least one TFT, and the at least one enclosed through hole further exposes a portion of the data line adjoining area at the direction perpendicular to the substrate.

14. The pixel structure as claimed in claim 10, wherein when observing from above the pixel structure, the at least one enclosed through hole whose number is the same as that of the at least one TFT, the pixel electrode around the at least one enclosed through hole surrounds each of the at least one TFT, and the pixel electrode is free from overlapping the at least one TFT.

15. The pixel structure as claimed in claim 10, wherein when observing from above the pixel structure, the at least one enclosed through hole includes a plurality of holes whose number is greater than that of the at least one TFT.

16. The pixel structure as claimed in claim 12, wherein the patterned area is removed from the pixel electrode within the peripheral boundary.

17. A pixel structure, comprising:
a substrate;
at least one thin-film transistor (TFT) disposed above the substrate, wherein each TFT includes a semiconductor layer;
a protective layer disposed on the at least one TFT, wherein the protective layer is an inorganic material; and
a pixel electrode having a patterned area being removed to form at least one enclosed through hole, and disposed directly on the protective layer, wherein the at least one enclosed through hole is fully surrounded by the pixel electrode and at a direction perpendicular to the substrate exposes a top surface of the at least one semiconductor layer by at least 50% thereof.

18. The pixel structure as claimed in claim 17, wherein the pixel electrode has a peripheral boundary, the patterned area is removed from the pixel electrode within the peripheral boundary, the pixel structure further comprises a data line having a data line adjoining area connected to the at least one TFT, and the at least one enclosed through hole further at the direction perpendicular to the substrate exposes at least a portion of the data line adjoining area.

* * * * *